United States Patent [19]

Borden

[11] Patent Number: 5,481,400
[45] Date of Patent: Jan. 2, 1996

[54] SURVIVABLE WINDOW GRIDS

[75] Inventor: Michael R. Borden, Los Angeles, Calif.

[73] Assignee: Hughes Aircraft Company, Los Angeles, Calif.

[21] Appl. No.: 149,438

[22] Filed: Nov. 9, 1993

[51] Int. Cl.⁶ ................................................. G02B 5/20
[52] U.S. Cl. ........................ 359/350; 359/361; 219/203
[58] Field of Search .................................. 359/350, 352, 359/356, 357, 358, 359, 360, 361, 351; 250/333, 338.3; 428/627; 427/162

[56] References Cited

U.S. PATENT DOCUMENTS 3,895,147  7/1975  Ahn et al. .............................. 359/360
4,712,881 12/1987  Shurtz et al. .......................... 359/352
4,871,220 10/1989  Kohin .................................... 359/350
5,194,985  3/1993  Hilton .................................... 359/359

*Primary Examiner*—Paul M. Dzierzynski
*Assistant Examiner*—Audrey Chang
*Attorney, Agent, or Firm*—M. E. Lachman; M. W. Sales; W. K. Denson-Low

[57] ABSTRACT

A recessed conductive grid formed in the exterior surface of an infra-red transmitting window provides shielding against electromagnetic interference and/or low observability. The recessed conductive grid, with its top surface flush with the exterior surface of the IR-transmitting window, is more resistant to erosion by rain and sand than prior art structures, in which the grid is formed on top of the exterior surface.

16 Claims, 2 Drawing Sheets

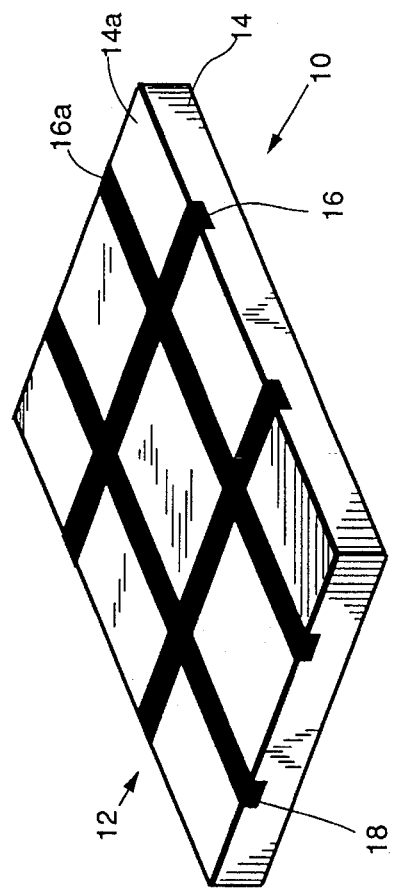
FIG. 1.
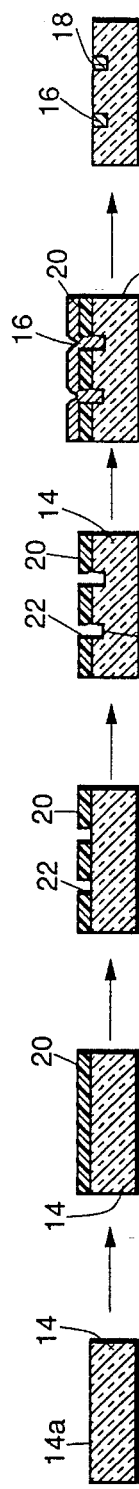
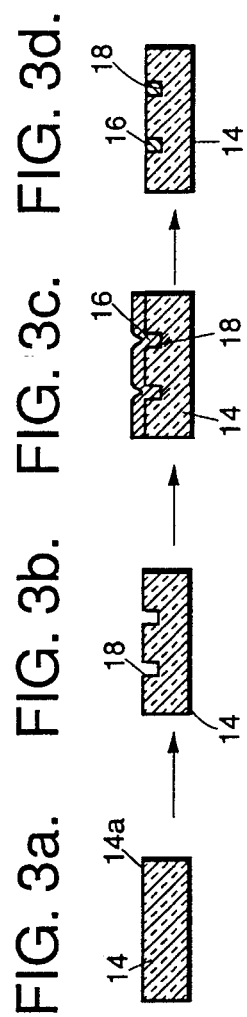

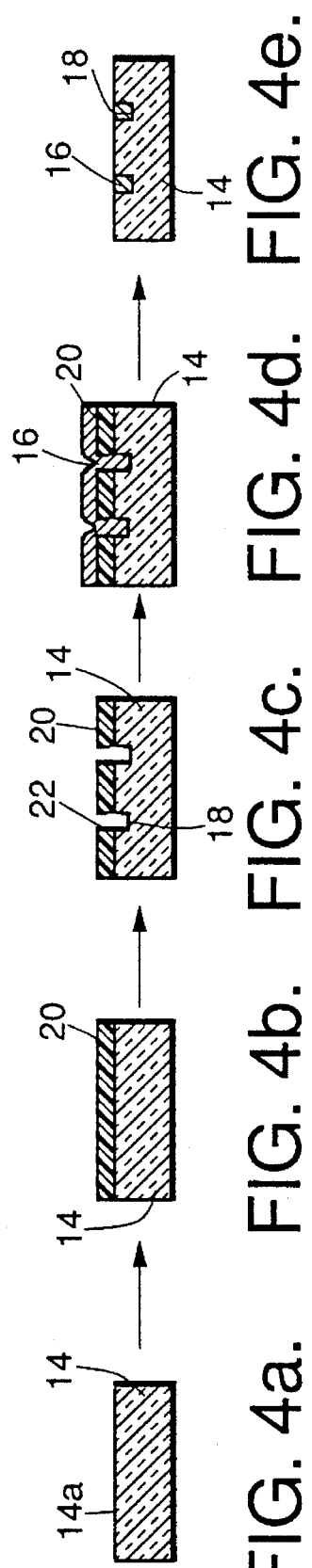

SURVIVABLE WINDOW GRIDS

BACKGROUND OF THE INVENTION

1. Field of the Invention

The present invention relates generally to infra-red (IR) transmitting windows used to protect IR sensors, and, more particularly, to such IR transmitting windows having thereon a metallic grid to provide shielding of the IR sensors against electromagnetic interference (EMI) or low observability.

2. Description of Related Art

A conductive metallic grid is desired on the exterior surface of an IR-transmitting window to provide EMI shielding or low observability. However, these grids and the antireflection coating covering them are partially or completely damaged in rain erosion tests. The combination antireflection/rain erosion coatings which are deposited on top of the grid-covered window are highly stressed, since they must conform to the non-flat surface. Consequently, these coatings are easily damaged by the rain erosion test. Furthermore, the grids are removed due in part to the poor adhesion of the metal grid lines to the window surface.

When subjected to a rain erosion environment at normal angle, the IR transmission is reduced by more than 5%, which is unacceptable according to industry standards. This reduction in IR transmission is primarily caused by partial removal of the antireflection coating, in addition to some substrate microcracks which occur at the surface of the window.

In one attempt to solve these problems, buried metallic grids have been produced by depositing an additional protective layer of the window material over the top of the grid, followed by a grinding and polishing of the additional layer. This approach is very expensive, requiring an additional deposition step and further processing steps, all of which are time-consuming and require additional IR-transmitting window material.

Thus, an IR-transmitting window that can survive rain and sand erosion and that can be fabricated with a minimum number of additional steps is required.

SUMMARY OF THE INVENTION

In accordance with the present invention, a conductive grid on an infrared window is provided in which the conductive grid is recessed into the window and its top surface made flush with the top surface of the window. Therefore, none of the metallic grid protrudes above the window surface. These recessed grids withstand rain and sand impacts and cleaning more so than prior art grids which protrude above the surface because none of the metal gridlines are exposed above the window surface and thus subject to being removed by the impinging raindrops. In addition, combination rain erosion/antireflection coatings deposited on the flush grid and window surface have lower coating stress and are therefore more resistant to damage.

An additional advantage of the present invention is that the flush grids may be cleaned easier with little risk of damaging the grid, as compared with cleaning of the prior art grids which extend above the window surface and are susceptible to degradation.

BRIEF DESCRIPTION OF THE DRAWINGS

FIG. 1 is a perspective view of a recessed grid flush with an infrared window surface, in accordance with the invention;

FIGS. 2a–f depict in cross-section one embodiment for fabricating the recessed grid in the infrared window surface;

FIGS. 3a–d depict in cross-section an alternative embodiment for fabricating the recessed grid; and FIGS. 4a–e depict in cross-section yet another alternative embodiment for fabricating the recessed grid.

DESCRIPTION OF THE PREFERRED EMBODIMENTS

In accordance with the present invention, a metallic grid is deposited, recessed, and flush with the window surface. The purpose of the grid is to provide EMI shielding and/or low observability.

Referring now to the drawings wherein like numerals designate like elements throughout, FIG. 1 depicts an assembly 10 comprising a recessed conductive grid 12 flush with the top surface 14a of an IR-transmitting window 14. The conductive grid 12 comprises two sets of a plurality of spaced conductive lines 16, one set intersecting the other set to form the grid. The top 16a of the conductive lines 16 is seen to be flush, or co-planar, with the exterior surface 14a of the IR-transmitting window 14.

The IR-transmitting window material 14 may comprise any of the materials used in the 8 to 12 μm range, such as zinc sulfide (ZnS) and zinc selenide (ZnSe), or any of the materials used in the 3 to 5 μm range, such as sapphire ($Al_2O_3$) and magnesium fluoride ($MgF_2$), or any combination thereof.

The conductive lines 16 may comprise any of the conductive materials commonly employed in EMI shielding, preferably gold, silver, or platinum. Of these, gold is most preferred, due to its combination of good corrosion resistance and, compared to platinum, its expense.

The center-to-center spacing of the conductive lines 16 ranges from about 100 to 400 μm, and preferably is about 100 μm. The line width of the conductive lines 16 is about 5 to 10 μm, and preferably is about 5 μm. The thickness of the conductive lines, that is, the depth of the recess 18, is about 0.5 μm.

The flush grid may be fabricated by several different approaches. The following discussion is directed to two such approaches, both of which are considered to be cost effective.

The first approach is depicted in FIGS. 2a–f. A pattern of the grid structure is developed in a photoresist coated on window surface. FIG. 2a depicts the window 14. FIG. 2b depicts the window 14 with a coating of photoresist 20 thereon. FIG. 2c depicts the photoresist 20 with openings 22 formed therein, in the pattern of the grid 12. Deposition and patterning of the photoresist are conventional.

Ion-milling or chemical etching is then be used to etch the grid pattern 22 into the window surface 14a to form recesses, or grooves, 18, as shown in FIG. 2d. The ion-milling and chemical etching procedures employ conventional process parameters. Next, a layer of metal 16, such as gold, is deposited everywhere over the surface of the photoresist 20, including in the recesses 18, as shown in FIG. 2e. The metal deposition employs conventional process parameters. Finally, the remaining photoresist 20 is removed, using well-known techniques, leaving the flush grid of FIG. 1, as depicted in FIG. 2f. Alternatively, the photoresist 20 could also be removed before the metal 16 is deposited. The excess metal extending above the window surface 14a is removed from the window surface using a light polish. This variation may be seen with reference to FIGS. 3b–d, below.

An alternate fabrication approach is depicted in FIGS. 3a–d. Starting with the IR window 14 shown in FIG. 3a, the groove pattern 18 is laser-etched in the window surface 14a, as shown in FIG. 3b, followed by the metal deposition to form the metal layer 16, as shown in FIG. 3c, in which the metal is formed on the window surface and in the grooves. The laser-etching employs well-known process parameters. The metal 16 on the window surface 14a and extending above the surface from the grooves 18 is removed by a post-polish. The resulting structure is shown in FIG. 3d, which is identical to FIG. 2f.

Yet another alternative fabrication approach is depicted in FIGS. 4a–e. This sequence is similar to that depicted in FIGS. 2a–f, except that after coating the window 14 with photoresist 20, a laser etch is done through the photoresist and into the surface of the window, as shown in FIG. 4c (which is the same as FIG. 2d). As in FIG. 2e, a layer of metal 16, such as gold, is deposited everywhere over the surface of the photoresist 20, including in the recesses 18, as shown in FIG. 4d. The window is processed as described above with reference to FIG. 2f, employing lift-off of the resist, resulting in the structure depicted in FIG. 4e.

In each instance, once the metal 16 is made flush with the window surface 14a, a rain erosion/antireflection coating (not shown) may be formed on the window surface. Such coatings and their formation are conventional.

EXAMPLES

A gold grid was formed in accordance with prior art procedures on the surface of a zinc sulfide window. The grid measured 400 μm center-to-center, with line width of 10 μm and line height of 0.5 μm. That grid is referred to herein as a "surface grid".

A gold grid was formed in accordance with the teachings of the present invention, recessed in the surface of a zinc sulfide window and flush with the exterior surface thereof. Ion-milling was used to form the recesses, which were filled with gold. The grid measured 400 μm center-to-center, with line width of 10 μm and line height of 0.5 μm. That grid is referred to herein as a "flush grid".

Both grids were coated with a multilayer combination rain erosion and antireflection coating comprising a conventional proprietary composition. The coated grid assemblies and uncoated ZnS were then subjected to rain-erosion testing, in which the window was subjected to the equivalent of rain impinging at an angle of 90°, that is normal to the window surface, at a speed of 470 miles per hour (756.4 Km per hour). The IR transmission was measured over the wavelength range of 8 to 12 μm both prior to the rain-erosion test and following the test. The industry specification requires that there be no more than a 5% reduction in average transmission over the wavelength range of 8 to 12 μm. The results are set forth in the Table below.

TABLE

Transmission of Various Coatings with Grids on ZnS Before and After Rain-Erosion Test.

| Grid/Coating Type | Average Transmission (%) | |
| --- | --- | --- |
| | Before | After |
| Uncoated ZnS | 67.2 | 58.4 |
| Grids + AR coating Surface grid | 69.7 | 62.8 |
| Flush grid | 69.6 | 65.5 |

Note: Average transmission from 8 to 12 μm; rain-erosion test conducted at 470 mph (756.4 Km/h), 90°.

As can be seen from the comparative results set forth in the Table, the surface grid of the prior art lost 6.9% in average transmission over the wavelength range of 8 to 12 μm as a result of the rain-erosion test, while the flush grid of the present invention lost only 4.1% in average transmission as a result of the rain-erosion test. This is the first non-buried grid structure that has ever passed the 90° test, to the Applicant's knowledge.

Thus, there has been disclosed a recessed conductive grid pattern that is flush with the exterior surface of an IR-transmitting window and methods for making the same. It will be readily apparent to those skilled in this art that various changes and modifications of an obvious nature may be made, and all such changes and modifications are considered to fall within the scope of the invention, as defined by the appended claims.

What is claimed is:

1. An IR-transmitting window having a conductive grid for providing shielding against electromagnetic interference, said IR-transmitting window being formed of a material selected from the group consisting of zinc sulfide, zinc selenide, sapphire, magnesium fluoride, and combinations thereof and having an exterior surface and said exterior surface having a top surface, said conductive grid being formed within said material at said exterior surface and said conductive grid having a top surface that is coplanar with said top surface of said exterior surface of said IR-transmitting window.

2. The IR-transmitting window of claim 1 wherein said conductive grid comprises a metal selected from the group consisting of gold, silver, and platinum.

3. The IR-transmitting window of claim 1 wherein said conductive grid comprises two sets of a plurality of spaced conductive lines, one set intersecting the other set to form said grid, said lines of a set separated by a center-to-center spacing of about 100 to 400 μm and said lines having a linewidth of about 5 to 10 μm and a recessed depth of about 0.5 μm.

4. The IR-transmitting window of claim 3 wherein said lines of a set are separated by a center-to-center spacing of about 100 μm and said lines have a linewidth of about 5 μm.

5. A method of making an IR-transmitting window having improved resistance to rain and sand erosion comprising;

(a) providing said IR-transmitting window, said window being formed of a material selected from the group consisting of zinc sulfide, zinc selenide, sapphire, magnesium fluoride, and combinations thereof and having an exterior surface and said exterior surface having a top surface;

(b) forming a plurality of grooves in said material at said exterior surface in a grid pattern;

(c) filling said grooves with a conductive material; and (d) removing any conductive material that extends above said exterior surface so that said conductive material terminates in a top surface that is coplanar with said top surface of said exterior surface of said IR-transmitting window.

6. The method of claim 5 wherein said grid pattern comprises two sets of a plurality of spaced grooves, one set intersecting the other set to form said grid, said grooves of a set separated by a center-to-center spacing of about 100 to 400 μm and said grooves having a linewidth of about 5 to 10 μm and a recessed depth of about 0.5 μm.

7. The method of claim 6 wherein said grooves of a set are separated by a center-to-center spacing of about 100 μm and said grooves have a linewidth of about 5 μm.

8. The method of claim 6 wherein said grid pattern is formed in said exterior surface by a process comprising:

(a) depositing a layer of photoresist on said exterior surface;

(b) patterning said layer of photoresist with said grid pattern to expose portions of said exterior surface; and (c) etching into said exterior surface to form said grooves of said grid pattern in said exterior surface.

9. The method of claim 8 wherein said conductive material is deposited on said photoresist layer and in said grooves and then said photoresist layer is removed.

10. The method of claim 8 wherein said photoresist layer is removed after etching said grooves in said exterior substrate and said conductive material is deposited on said exterior surface and in said grooves.

11. The method of claim 8 wherein said etching into said exterior surface is done by ion milling.

12. The method of claim 8 wherein said etching into said exterior surface is done by chemical etching.

13. The method of claim 6 wherein said grid pattern is formed in said exterior surface by etching grooves therein.

14. The method of claim 13 wherein said etching is done by laser etching.

15. The method of claim 6 wherein grid pattern is formed in said exterior surface by a process comprising:

(a) depositing a layer of photoresist on said exterior surface; and (b) laser etching through said photoresist and into said exterior surface to form said grooves of said grid pattern in said exterior surface.

16. The method of claim 15 wherein said conductive material is deposited on said photoresist layer and in said grooves and then said photoresist layer is removed.

* * * * *